United States Patent [19]

Shiina et al.

[11] Patent Number: 4,792,762

[45] Date of Patent: Dec. 20, 1988

[54] BATTERY CHECK SYSTEM

[75] Inventors: Michihiro Shiina; Shigenori Goto; Junichi Iwamoto, all of Ohmiya; Hisashi Hamada, Tokyo, all of Japan

[73] Assignee: Fuji Photo Film Co., Ltd., Japan

[21] Appl. No.: 88,940

[22] Filed: Aug. 24, 1987

[30] Foreign Application Priority Data

Aug. 28, 1986 [JP] Japan ................ 61-130293[U]

[51] Int. Cl.$^4$ ............................. G01N 27/46
[52] U.S. Cl. ....................... 324/426; 340/636; 354/468; 354/484
[58] Field of Search ............ 324/426, 433, 437, 120; 340/636; 320/48; 429/7, 97; 354/468, 484

[56] References Cited

U.S. PATENT DOCUMENTS 4,357,574  11/1982  Takamisawa et al. .......... 324/426
4,618,857  10/1986  Dubois et al. ................ 340/636

Primary Examiner—Reinhard J. Eisenzopf
Assistant Examiner—Anthony L. Miele
Attorney, Agent, or Firm—Pasquale A. Razzano

[57] ABSTRACT

A battery check system for a device which can be supplied with power either from a battery pack or from a D.C. plug adapted to be connected to an A.C. source by way of an AC/DC converter is provided with a large current load check mode for checking the supply voltage under a large load condition and a small current load check mode for checking the supply voltage under a small load. There is provided a mode switching means for setting the mode of the battery check system to the large current load check mode when said device is to be supplied with power from the battery pack and to the small current load check mode when said device is to be supplied with power through the D.C. plug.

2 Claims, 3 Drawing Sheets

BATTERY CHECK SYSTEM

BACKGROUND OF THE INVENTION

1. Field of the Invention

This invention relates to a battery check system for a device having a dual power supply system, e.g., a device which can be supplied with power either from an exclusive battery pack or from an external power source.

2. Description of the Prior Art

In many recent photographic cameras, various control mechanisms, driving mechanisms and the like are electrically driven. Further, there has been developed a photographic camera which has a built-in microcomputer and in which each mechanism is electrically controlled. In such photographic cameras, a predetermined supply voltage must be ensured.

In a large-sized photographic camera, a dedicated battery pack having a large capacity is generally used in place of the dry cell employed as a power source in a normal 35 mm camera in consideration of the large power consumption of the large-sized camera. The battery back generally comprises a plurality of dry cells connected together to obtain a predetermined supply voltage or a secondary battery such as a nickel-cadmium battery. Especially, the nickel-cadmium battery is advantageous as the power source for a photographic camera requiring a large electric current in that it can stably discharge a large electric current and is easier to handle than the battery pack formed of a plurality of dry cells.

Since if the supply voltage is lowered below a certain level, the camera can malfunction, the camera is generally provided with a battery check system for detecting residual capacity of the battery pack so that the time for renewing the battery pack can be easily known.

On the other hand, some cameras are arranged so that power can be supplied from either of two power supply systems, one being a battery pack and the other comprising a D.C. plug connected to an AC/DC converter, so that the camera can be supplied with power via the D.C. plug in a place like a studio where an A.C. power source is available, thereby facilitating the taking of numbers of photographs, continuously.

As the battery check system for the camera having such a dual power supply system, there has been known one which has a battery check circuit common to the two power supply systems.

However, since the battery pack has a small internal resistance, if a battery check is effected under load conditions where the load is not much more than the actual load occuring upon normal photographing, the voltage drop is not sufficient to check the voltage of the battery pack with high accuracy. Accordingly, the residual capacity must be determined on the basis of the voltage drop when a large current load several to ten or so times as large as the actual load is instantaneously applied thereto. Therefore, a large current must be discharged from the battery pack to some extent.

On the other hand, in the case that the camera is supplied with power through the D.C. plug connected to the A.C. source by way of the AC/DC converter, it may be considered that power can be infinitely supplied, and accordingly, battery checking for detecting the residual battery capacity is not necessary. In this case, detection of voltage drop due to failure of the AC/DC converter or the like, i.e., detection of whether or not normal voltage is supplied, is enough. Such detection can be satisfactorily performed by detecting open-circuit voltage under conditions substantially equal to or smaller than the actual load.

Therefore, if the battery check circuit is common, when battery checking is effected for checking the supply voltage through the D.C. plug, there flows a large current which is not smaller than several times as large as the actual load flowing during battery checking of the battery pack and which can exceed the rated output of the AC/DC converter. If the rated output of the AC/DC converter is exceeded, the circuit elements forming the A.D. converter can be damaged, and if the AC/DC converter is provided with an over current protecting circuit, the protecting circuit may operate to interrupt the power supply, thereby preventing the battery check. On the other hand, when the rated output of the AC/DC converter is selected to conform to the over current, the rating of the elements forming the AC/DC converter such as capacitors, transformers and resistors must be unnecessarily high, whereby the elements are enlarged in size and the manufacturing cost is increased.

SUMMARY OF THE INVENTION

In view of the foregoing observations and description, the primary object of the present invention is to provide a battery check system which can check the supply voltage through the D.C. plug under a load condition different from the condition under which the battery check of the battery pack is effected.

In accordance with the present invention, there is provided a battery check system for a device which can be supplied with power either from a battery pack or from a D.C. plug adapted to be connected to an A.C. source by way of an AC/DC converter characterized in that the battery check system is provided with a large current load check mode for checking the supply voltage under a large load condition and a small current load check mode for checking the supply voltage under a small load, and there is provided a mode switching means for setting the mode of the battery check system to the large current load check mode when said device is to be supplied with power from the battery pack and to the small current load check mode when said device is to be supplied with power through the D.C. plug.

DESCRIPTION OF THE PREFERRED EMBODIMENT

Figure 1:
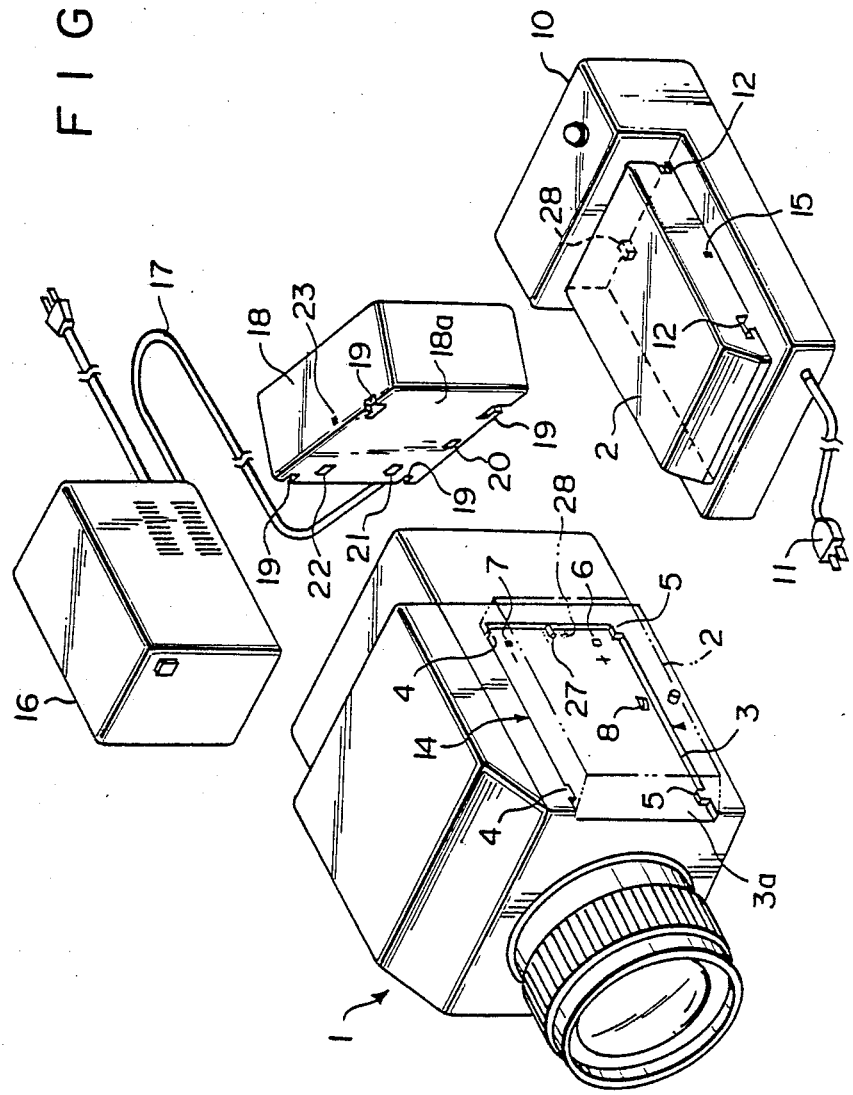
FIG. 1 is a perspective view showing a photographic camera provided with a battery check system in accordance with an embodiment of the present invention.

In FIG. 1, a camera body 1 is provided on one side thereof with a recess 3 for mounting a dedicated battery pack 2. Two engaging projections 4 are formed on the upper edge of the recess 3 and two engaging projections 5 are formed on the lower edge of the same. A positive terminal 6 and a negative terminal 7 for supplying power to the camera body 1 are provided to project outward from the seat surface 3a (the bottom of the recess 3) under the force of respective springs (not shown). Further, a locking projection 8 projects from the seat surface 3a under the force of a spring (not shown).

The battery pack 2 comprises a plurality of built-in nickel-cadmium batteries, and can be charged by connecting the power plug 11 of a battery charger 10 to an A.C. plug receptacle and placing the battery pack 2 on the charger 10. The charged battery pack 2 is mounted in the recess 3 of the camera body 1. The battery pack 2 is provided, on opposite edges, with engaging grooves 12 which are adapted to be engaged with the engaging projections 4 and 5 on the recess 3, and the battery pack 2 is fixed on the camera body 1 by engagement between the engaging projections 4 and 5 and the engaging grooves 12.

On the bottom surface of the battery pack 2 are provided output terminals to be brought into contact with the positive terminal 6 and the negative terminal 7 of the camera body 1, and an engagement hole to be engaged with the locking projection 8. When the battery pack 2 is inserted into the recess 3 with a mark 15 on the battery pack 2 being aligned with a mark 14 on the camera body 1 and is slid rearward, the locking projection 8 is engaged with the locking hole on the bottom surface of the battery pack 2 to position the battery pack 2 in place with respect to the camera body 1 where the output terminals on the bottom surface of the battery pack 2 are respectively brought into contact with the positive terminal 6 and the negative terminal 7.

Instead of the battery pack 2, a D.C. plug 18 can be mounted in the recess 3 of the camera body 1 so that the camera can be supplied with power from the D.C. plug 18 in a place like a studio where an A.C. power source is available, thereby facilitating the taking of numbers of photographs continuously. The D.C. plug 18 is connected to an AC/DC converter 16 by a cord 17. The D.C. plug 18 is mounted on the camera body 1 in the same manner as the battery pack 2. That is, the bottom surface 18a of the D.C. plug 18 is substantially the same as the bottom surface of the battery pack 2 in shape and structure, and is provided with engaging grooves 19 adapted to be engaged with the engaging projections 4 and 5, an engaging hole 20 adapted to be engaged with the locking projection 8, and output terminals 21 and 22 to be brought into contact with the positive terminal 6 and the negative terminal 7. Further, the D.C. plug 18 is provided with a mark 23 similar to the mark 15 on the battery pack 2.

Figure 2:
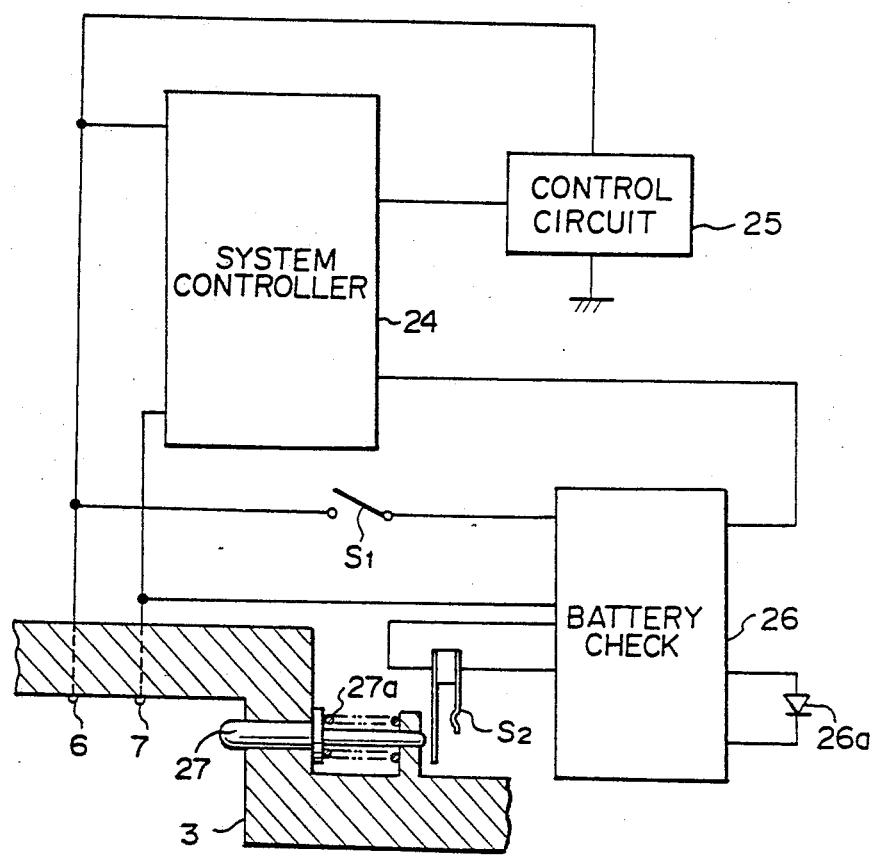
FIG. 2 is a block diagram showing the control section of the camera.
Figure 3:
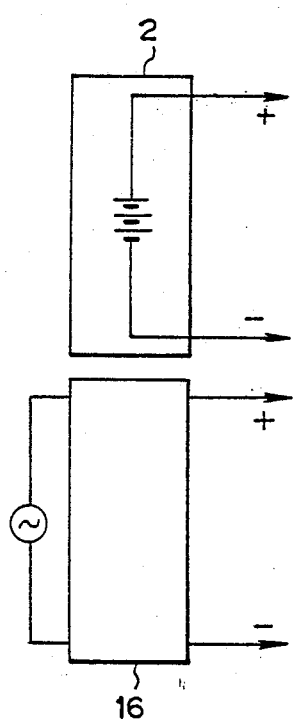
FIG. 3 is a circuit diagram of the battery check system.
Figure 3:
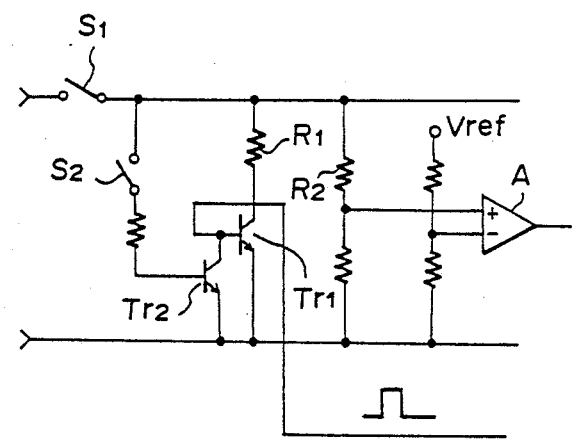

In FIG. 2, reference numeral 24 denotes a system controller that controls the operation of the camera, and reference numeral 25 denotes a control circuit for controlling film feed, exposure and the like. When the system controller 24 and the control circuit 25 are energized, the camera becomes ready for operation. Further, reference numeral 26 denotes a battery check system in accordance with an embodiment of the present invention. The battery check system 26 has an electric circuit such as is shown in FIG. 3. That is, to the downstream side of a main switch S1 for the battery check are connected in parallel two resistors R1 and R2. The resistor R1 has a low resistance and functions as a load for instantaneous flow of an electric current substantially 5 to 10 times as large as the rating, and the resistor R2 has a high resistance and functions as a load for the flow of an electric current which is small as compared with the rated load. As will become apparent later, the output voltage of the resistor R1 or R2 is compared with a reference voltage Vref by an operational amplifier A, and whether or not the camera can be operated is determined on the basis of the result of the comparison. This determination is displayed by a light emitting diode 26a in the viewfinder in this particular embodiment.

The battery check circuit is arranged to be switched between a large current load check mode in which both the resistors R1 and R2 are used as the load, and the small current load check mode in which only the resistor R2 is used as the load. This mode switching is made by a mode switching means comprising a switch S2 and transistors Tr1 and Tr2. When the main switch S1 is turned on and the battery check is to be effected, a pulse signal is delivered to the base of the transistor Tr1 from the system controller 24. If the switch S2 is opened at this time, supply current flows through the resistor R1. That is, the battery check circuit is set to the large current load check mode. On the other hand, if the switch S2 is closed when the pulse signal is delivered to the base of the transistor Tr1, the pulse signal flows to the collector of the transistor Tr2 and supply current does not flow through the resistor R1. In this case, the battery check circuit is set to the small current load check mode.

In order to automatically effect switching of the check modes, a pin 27 (FIGS. 1 and 2) is provided in the recess 3 to project inward from the rear wall of the recess 3 under the force of a spring 27a. As clearly shown in FIG. 2, when the pin 27 is pushed, overcoming the force of the spring 27a, the switch S2 is closed. As shown in FIG. 1, the battery pack 2 is provided with a cutaway portion 28 at a portion corresponding to the pin 27 so that the pin 27 is received in the cutaway portion 28 when the battery pack 2 is mounted in the recess 3 and is not pushed. On the other hand, when the D.C. plug 18 is mounted in the recess 3, the pin 27 is pushed by the side wall of the plug 18. Thus, the switch S2 is automatically closed when the D.C. plug 18 is mounted in the recess 3 and opened when the battery pack 2 is mounted therein.

In the manner described above, the switch S2 is automatically closed and the check mode is automatically set to the large current load check mode when the battery pack 2 is mounted in the recess 3. When the main switch S1 is subsequently closed for the battery check, the pulse signal is delivered to the base of the transistor Tr1 and the supply current flows through both the resistors R1 and R2. Accordingly a large current instantaneously flows, and the residual capacity of the battery pack 2 is determined on the basis of the voltage drop at this time.

On the other hand, the switch S2 is opened and the check mode is set to the large current load check mode when the D.C. plug 18 is mounted in the recess 3. When the main switch S1 is subsequently closed for the battery check, the pulse signal flows to the collector of the transistor Tr2 and accordingly no current flows through the resistor R1. In this case, an electric current smaller than the rated load flows through the resistor R2, and the open-circuit voltage is detected. As described above, since it may be considered that the power source capacity is infinite when the D.C. plug is used, detection of the open-circuit voltage is enough as the battery check. Thus, in the battery check system in accordance with this embodiment, an unnecessarily large current does not flow when the D.C. plug is used and accordingly, the rating of the elements of the AC/DC converter such as capacitors, transformer, resistors and the like can be selected on the basis of the actual load without any possibility of damage to the elements.

The main switch S1 may be arranged to be automatically closed in response to a signal from the system controller 24. For example, the main switch S1 may be arranged to be automatically closed to effect a battery check at certain intervals during the photographing. Further, the shape and position of the pin 27 for switching the check mode need not be limited to those described above. Further, the switch S2 may be arranged so that the check mode is set to the large current load check mode when the switch S2 is closed and to the small current load check mode when the switch S2 is opened.

Though, in the embodiment described above, the battery check system of the present invention is applied to a photographic camera, the battery check system of the present invention can be applied to various other devices having a dual power supply system.

We claim:

1. A battery check system for a device which can be supplied with power either from a battery pack or from a D.C. plug adapted to be connected to an A.C. source by way of an AC/DC converter, the battery pack and the D.C. plug being adapted to be selectively mounted on a power supply mounting portion of the device, characterized in that the battery check system is provided with a large current load check mode for checking the supply voltage under a large load condition and a small current load check mode for checking the supply voltage under a small load, and there is provided a mode switching means for setting the mode of the battery check system to the large current load check mode when the battery pack is mounted on the power supply mounting portion of the device and to the small current load check mode when the D.C. plug is mounted on the said power supply mounting portion.

2. A battery check system as defined in claim 1 in which said switching means comprises a switch which is automatically actuated in response to the mounting of the battery pack or the D.C plug.

* * * * *